United States Patent [19]
Lee

[11] Patent Number: 4,857,689
[45] Date of Patent: Aug. 15, 1989

[54] RAPID THERMAL FURNACE FOR SEMICONDUCTOR PROCESSING

[75] Inventor: Chunghsin Lee, Lynnfield, Mass.

[73] Assignee: High Temperature Engineering Corporation, Danvers, Mass.

[21] Appl. No.: 173,137

[22] Filed: Mar. 23, 1988

[51] Int. Cl.⁴ .............................................. H05B 6/06
[52] U.S. Cl. ............................... 219/10.71; 219/10.77; 219/518; 266/87; 373/144; 432/45; 432/128
[58] Field of Search ............. 219/10.71, 10.69, 10.491, 219/10.77, 494, 518, 476, 480; 432/45, 77-79, 85, 128, 129, 132, 163; 266/87, 92, 93; 373/1, 4, 6, 7, 144, 145; 340/686

[56] References Cited

U.S. PATENT DOCUMENTS

| | | | |
|---|---|---|---|
| 3,136,876 | 6/1964 | Crosthwait | 219/10.77 |
| 3,265,470 | 8/1966 | Keller | 219/10.77 |
| 3,355,158 | 11/1967 | Campbell et al. | 432/79 |
| 3,740,859 | 6/1973 | Patton et al. | 219/10.77 X |
| 3,935,416 | 1/1976 | Cachat | 219/10.77 |
| 4,008,387 | 2/1977 | Green et al. | 219/10.77 X |
| 4,158,758 | 6/1979 | Kunioka et al. | 219/10.71 X |
| 4,195,820 | 4/1980 | Berg | 266/87 |
| 4,245,818 | 1/1981 | Elhaus et al. | 266/87 |

OTHER PUBLICATIONS

J. C. Gelpey et al, "Rapid Annealing Using the Water-Wall Arc Lamp," Nuclear Instruments and Methods in Physics Research, 1985, pp. 316-320.

D. Aitken et al, "A New VLSI Compatible Rapid Thermal Processing System," Nuclear Instruments and Methods, 1987, pp. 622-626.

S. Leavitt, "RTP: On the Edge of Acceptance," Semiconductor International, Mar. 1987, pp. 64-70.

R. T. Fulks et al, "Rapid Isothermal Annealing of Ion Implantation Damage Using a Thermal Radiation Source," Appl. Phys. Lett. 39(8), 15 Oct. 1981, pp. 604-606.

J. C. C. Fan et al, "Transient Heating with Graphite Heaters for Semiconductor Processing," Appl. Phys. Lett., 1982, pp. 751-758.

T. O. Sedgwick, "Short Time Annealing," J. Electrochem. Soc., Feb. 1983, pp. 484-492.

Primary Examiner—Philip H. Leung
Attorney, Agent, or Firm—Lahive & Cockfield

[57] ABSTRACT

A semiconductor wafer processing furnace includes an elongated processing chamber enclosing a first zone and a second zone extending along a first reference axis, and a wafer support assembly having a support member and associated translation elements for selectively translating the support member between the zones, along the first reference axis, in response to an applied position signal. Temperature elements control the first and second zones to have selected first and second temperatures, respectively. A controller applies the position signal to the translation elements, in response to an applied control signal representative of a desired temperature of the region surrounding the support member. Responsive to the position signal, the translation elements position the support member along the reference axis such that the temperature of the region surrounding the support member substantially matches the desired temperature.

28 Claims, 2 Drawing Sheets

RAPID THERMAL FURNACE FOR SEMICONDUCTOR PROCESSING

BACKGROUND OF THE INVENTION

Horizontal diffusion furnaces have been widely used for many years for a variety of semiconductor fabrication processes including annealing, diffusion, oxidation, and chemical vapor deposition. As a result, these processes are well understood, especially with regard to the impact of process variables on the quality and uniformity of resulting products.

As semiconductor fabrication continues to advance, requiring finer dimensional tolerances and control, the semiconductor industry has become concerned that conventional horizontal tube furnace designs may not be able to meet future product requirements, particularly in connection with large wafer sizes. The semiconductor industry is particularly concerned with particulate control, automation, small critical dimensions, and shallow junctions.

Modern integrated circuit design dictates that line width be smaller than 1 micron, and that junction depth be less than a few hundred angstroms. Thus, heating duration on the wafer must be reduced to limit the lateral diffusion of the dopants, and the associated broadening of line dimension. Heating duration must also be limited to reduce forward diffusion so the junction depth does not shift. Less heating also results in less damage to wafers. Issues such as larger wafer size, wafer loading/unloading automation, and particulate control are now so critical that conventional tube furnaces can no longer meet process requirements. Two different approaches, vertical tube furnaces and single wafer rapid thermal processors, have been developed to meet the more demanding process requirements of advancing semiconductor technology. Both approaches are designed to accommodate larger wafer sizes, to be easily automated, to have a smaller footprint, and to be bulkhead mounted. Unfortunately, neither of these technologies has fulfilled its promise in terms of process performance.

The vertical diffusion furnaces are designed to support the processing tube in the vertical position. The wafers can be loaded from either the top or bottom and can be held either horizontally or vertically. This design reduces wafer contamination problems and some automation concerns. However, vertical furnaces have inherited most of the major weaknesses of the horizontal systems, such as poor process control for larger wafer sizes, excessive time-at-temperature, inconsistent wafer to wafer uniformity, and difficult process control due to the batch processing of wafers.

The Rapid Thermal Processor (RTP), in contrast, employs a high intensity light source with appropriate reflectors to heat single wafers. In a conventional RTP system, wafers are heated to temperatures of approximately 450 to 1400 degrees Centigrade and cooled to room temperature in a matter of seconds, rather than minutes as in a tube furnace. The object of Rapid Thermal Processing is to provide an alternative thermal technique that would avoid the problem of dopant profile shifting.

Currently, a number of commercial rapid thermal processors are available. Each uses some type of lamp as the heat source. A lamp source has the advantage of very low thermal mass, so that it can be powered up and down very rapidly. As a result, lamp sources can heat up the wafer very rapidly, and allow the wafer to cool more quickly. However, there are several problems associated with lamp-based heating systems which inhibit the incorporation of RTP's into production environments.

All lamp powered systems require a reflector to distribute radiated power evenly onto the wafer. Because all lamp systems use line sources of light, it is difficult to design a reflector which can evenly distribute the radiation onto wafers of different sizes. Additionally, during operation, lamps are turned on and off very rapidly. There exists no means for maintaining uniform power distribution and temperature uniformity during transient periods.

Moreover, all lamps age with time, so that it is difficult to maintain repeatable performance. The heat source of lamp powered systems is separated from the processing chamber by a quartz plate, and any contamination on this plate will affect temperature uniformity.

In addition to these heat source limitations, RTPs have still other deficiencies. For example, the processing chamber is characterized by design requirements which conflict during the heating and cooling periods. In particular, when temperature is ramping up, the processing chamber should ideally have minimum absorption, to reduce the power requirement. When temperature is ramping down, the processing chamber should have maximum absorption, to speed wafer temperature drop. As a result of these two conflicting design requirements, chamber design cannot be optimized.

Further, the switching of large lamp current during operation can generate correspondingly large magnitudes of electro-magnetic interference (EMI), which affect nearby electronic devices. Lastly, lamp-based heating systems do not use power efficiently. Consequently, large power and facility resources are required.

RTPs have not proven to be a reliable means of obtaining consistently uniform and repeatable results. One of the persistent problems associated with Rapid Thermal Processing is the difficulty in maintaining a uniform temperature across a wafer that is essentially floating in free space while being almost instantaneously heated, processes and cooled. No rapid thermal processor manufacturer has been able to solve the complex optical design requirements necessary to achieve consistently satisfactory uniformity across a wafer. Additionally, all rapid thermal processors suffer the effects of light flux degradation caused by aging of the light source, resulting in progressive degradation of repeatability.

Accordingly, there exists a need for a semiconductor fabrication and processing system which can accommodate large semiconductor wafers while maintaining satisfactory and repeatable process control, especially temperature uniformity and stability.

It is thus an object of the invention to provide an improved semiconductor fabrication and processing furnace.

It is another object of the invention to provide an improved semiconductor processing furnace which maintains enhanced temperature uniformity across the semiconductor wafer during processing.

It is a further object of the invention to provide a semiconductor processing furnace which provides rapid cooling of the wafer, and which maintains a rapid heating rate.

It is still another object of the invention to provide a semiconductor fabrication furnace which is characterized by low cost, power consumption, and maintenance requirements.

Other general and specific objects of the invention will in part be obvious and will in part appear hereinafter.

SUMMARY OF THE INVENTION

These objects are attained by the invention which provides a semiconductor wafer processing furnace including an elongated processing chamber enclosing a first zone and a second zone extending along a first reference axis. The invention also includes a wafer support assembly having a support member and associated elements for selectively translating the support member between the zones along the first reference axis in response to an applied position signal.

The invention further includes first temperature elements for controlling the second zone to be substantially at a second temperature, and a controller including elements responsive to an applied control signal for generating the position signal and for applying position signals to the wafer support assembly, the control signal being representative of a desired termperature of the region. The support member is positioned along the reference axis such that the temperature of the region substantially matches the desired temperature.

In another aspect of the invention, the furnace further includes elements for controlling the temperature gradient along the first reference axis to be monotonic between the first and second zones. One aspect of the invention also includes sensor elements for generating a temperature signal representative of the temperature of the region proximal to the support member. In this aspect of the invention, the controller further includes elements responsive to the temperature signal and the applied control signal for generating the position signal, the position signal being representative of the difference between the temperature of the region and the desired temperature.

Another aspect of the invention also provides sensor elements for generating a temperature signal representative of the temperature of a semiconductor wafer. In this aspect of the invention, the controller further includes elements responsive to the temperature signal and the applied control signal for generating the position signal, the position signal being representative of the difference between the temperature of the wafer and a desired temperature of the wafer.

A further aspect of the invention provides a semiconductor wafer processing system including an elongated processing chamber enclosing a first zone and a second zone extending along a first reference axis, and a wafer support assembly including a support member and associated elements for selectively translating the support member between the zones along the first reference axis in response to an applied position signal.

This aspect of the invention also includes first temperature elements for controlling the first zone to be substantially at a first temperature, and sensor means for generating a temperature signal representative of the temperature of the region proximal to said support member.

This aspect of the invention further provides a controller including elements responsive to the temperature signal and an applied control signal for generating position signals and for applying the position signals to the wafer support assembly. The control signal is representative of a desired temperature of the region, and the position signal is representative of the difference between the temperature of the region and the desired temperature. The support member is positioned along the reference axis such that the temperature of the region substantially matches the desired temperature.

In still another aspect of the invention, the sensor elements include elements for generating a temperature signal representative of the temperature of a semiconductor wafer.

In accordance with one practice of the invention, the first reference axis is substantially vertical. Alternatively, the first reference axis can be substantially horizontal.

The invention also provides elements for controlling the temperature of the second zone to be substantially at a second temperature, and elements for controlling the temperature gradient along the first reference axis to be monotonic between the first and second zones.

The invention also provides elements for generating the control signal. These generating elements include elements for generating the control signal to be representative of desired temperature up-ramp states, constant states and down-ramp states.

The invention includes elements for automatically loading at least one semiconductor wafer-to-be-processed on to the support member, elements for automatically unloading at least one semiconductor wafer-to-be-processed from the support member, and elements for supporting a semiconductor wafer-to-be-processed in the region proximal to the support member.

In one aspect of the invention, the supporting elements include elements for controlling the magnitude of thermal radiation of the supported wafer-to-be-processed to be substantially uniform across the supported wafer-to-be-processed.

In another aspect of the invention, the wafer supporting elements include the support member and elements for positioning the wafer-to-be-processed with a predetermined side of the wafer-to-be-processed in the proximal region and opposite to and displaced from the support member.

This aspect of the invention also includes a plurality of ports disposed in the surface of the support member and opposite to the location of the predetermined side of a wafer-to-be-processed which is supported by the wafer positioning means, and coupling elements for coupling the ports to a gas supply.

In accordance with the invention, the chamber can be constructed from alumina, silicon carbide, quartz and ceramic materials.

The invention further provides cooling elements within the chamber, the cooling elements including elements for selectively directing a flow of cooling gas across at least one surface of a wafer-to-be-processed affixed to the surface member.

The invention will next be described in connection with certain illustrated embodiments. However, it should be clear that various changes, modifications and additions can be made by those skilled in the art without departing from the spirit or scope of the invention as defined in the claims.

BRIEF DESCRIPTION OF THE DRAWINGS

For a fuller understanding of the nature and objects of the invention, reference should be made to the following detailed description and the accompanying drawings, in which.

DESCRIPTION OF ILLUSTRATED EMBODIMENTS

Figure 1:
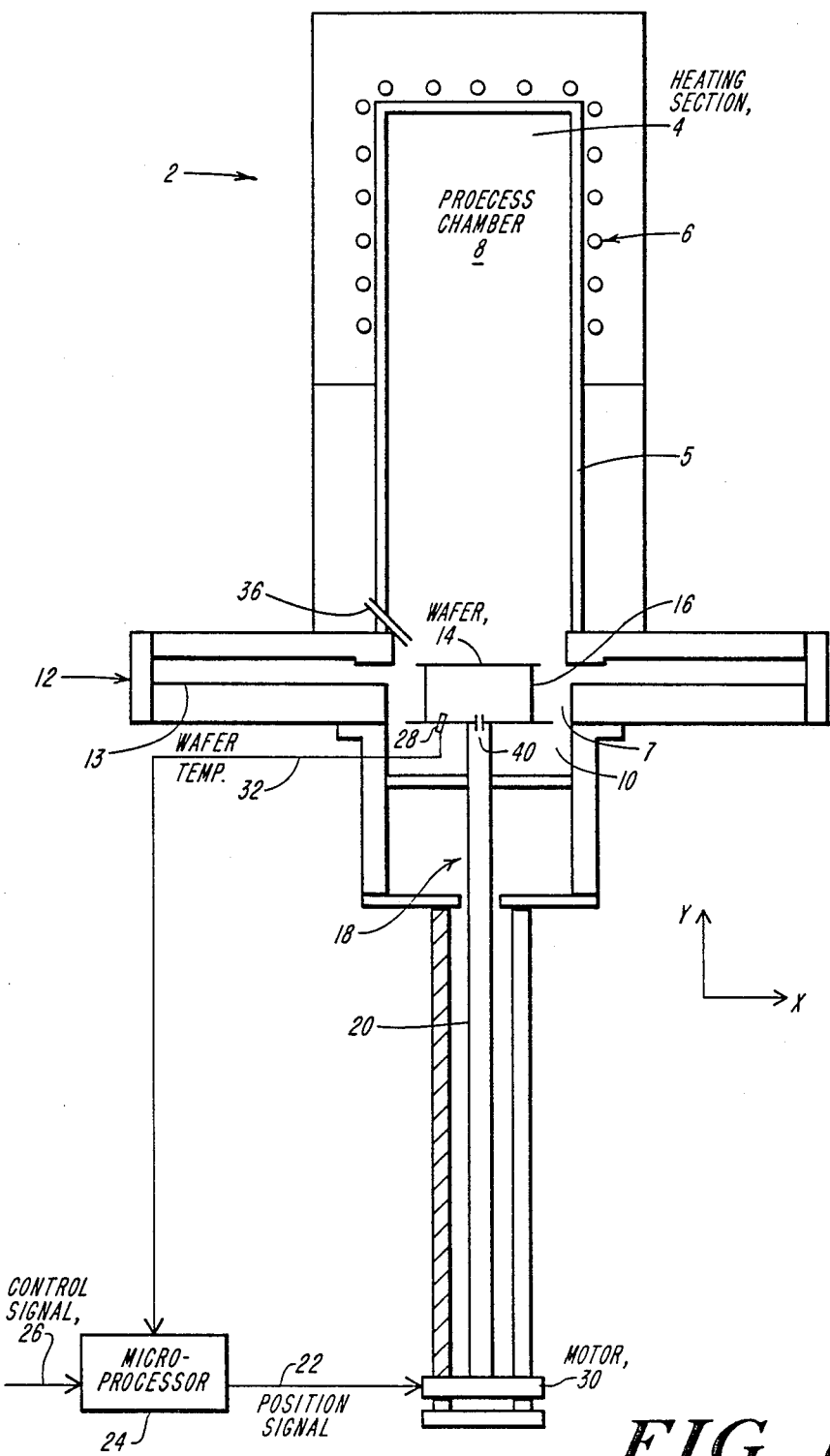
FIG. 1 is a schematic diagram of a semiconductor processing furnace according to the invention.

FIG. 1 shows a simple schematic diagram of a rapid thermal furnace 2 according to the invention. It consists of four major sections: the heating section 4, the temperature control section 10, the process chamber section 8, and the wafer load/unload section 12. The heating section 4 is preferably a modified version of that utilized in a conventional vertical furnace. A close-ended tube 5 preferably constructed of quartz, silicon carbide or other suitable materials is inserted into the furnace 2 through the lower opening 7 to serve as the process chamber 8. The furnace 2 is preferably operated at a constant temperature to maintain an isothermal zone in the process chamber 8.

A single wafer 14 is loaded onto a wafer support 16, preferably constructed of quartz, located at the lower opening end 7 of the process chamber 8. The quartz support 16 may have a radiation guard ring (not shown in FIG. 1) around the wafer circumference to maintain temperature uniformity by reducing radiation loss around the wafer edge. In this embodiment, process gas port 40 is located beneath wafer 14. The entire support structure 16 is linked to a raising/lowering mechanism 20, and its position is preferably feedback-controlled by a wafer temperature sensor 28 located under wafer 14, and a servo motor 30. The heat-up and cool-down rates are accurately controlled by moving the wafer 14 to an appropriate elevation within the heating section 4.

The rate of raising and lowering the wafers 4 and the time/temperature cycle are controlled by a microprocessor 24 coupled with the temperature feedback 32 from temperature sensor 28. Temperature sensor 28 is preferably anoptical pyrometer or other suitable temperature measuring device known in the art.

Control signal 26, shown in FIG. 1 being applied to microprocessor 24, is a signal representative of a desired temperature of a region proximal to the wafer 14. The signal can be generated by a user-controlled device such as a potentiometer. Alternatively, microprocessor device 24 can be programmed, in a manner known in the art, to generate control signals representative of stored temperature profile data.

After a user-selected duration in the isothermal zone of process section 8, the wafer 14 is lowered to a standby position. The wafer 14 is further cooled with aid of cold gas jet 36, and is finally removed from the process chamber 8 by a wafer load/unload arm 13.

The temperature ramp-up and ramp-down rates are controlled by the location of the wafer 14 within the process chamber 8, rather than by varying the power input or isothermal temperatures as in prior art devices. In this way, the ramp up/down rates can be quite rapid, without the transient temperature nonuniformities characteristic of conventional furnaces and RTPs. However, the furnace 2 still retains the capability of varying isothermal temperatures.

The invention is thus a hybrid of a vertical tube furnace and rapid thermal processor. It provides the advantages of both technologies without the disadvantages of either.

A preferred embodiment of the invention uses resistance-heated elements or RF heated blackbody cavity susceptors as the heat source 6. This heat source is simple to implement, well characterized and widely accepted as a reliable technique for stable and uniform control of temperature. Furnaces in accordance with the invention have been constructed for processing wafers up to 8 inches in diameter. The design can easily be scaled to accommodate larger size wafers. Moreover, furnaces according to the invention can also be configured to process wafers in batch.

The furnace illustrated in FIG. 1 is capable of thermal ramping that is as fast as that of rapid thermal processors and as uniform as that of conventional tube furnace. Temperature control of the wafer by position rather than input energy prevents the transient problem associated with conventional tube furnaces and rapid thermal processors.

Those skilled in the art will realize that the invention offers the advantages of a low power rating requirement, in contrast to lamp systems, and a heat source which is maintained at constant temperature, so that no EMI is generated due to power switching, and no large peak power demand is created which can lead to power supply fluctuations.

Figure 2:
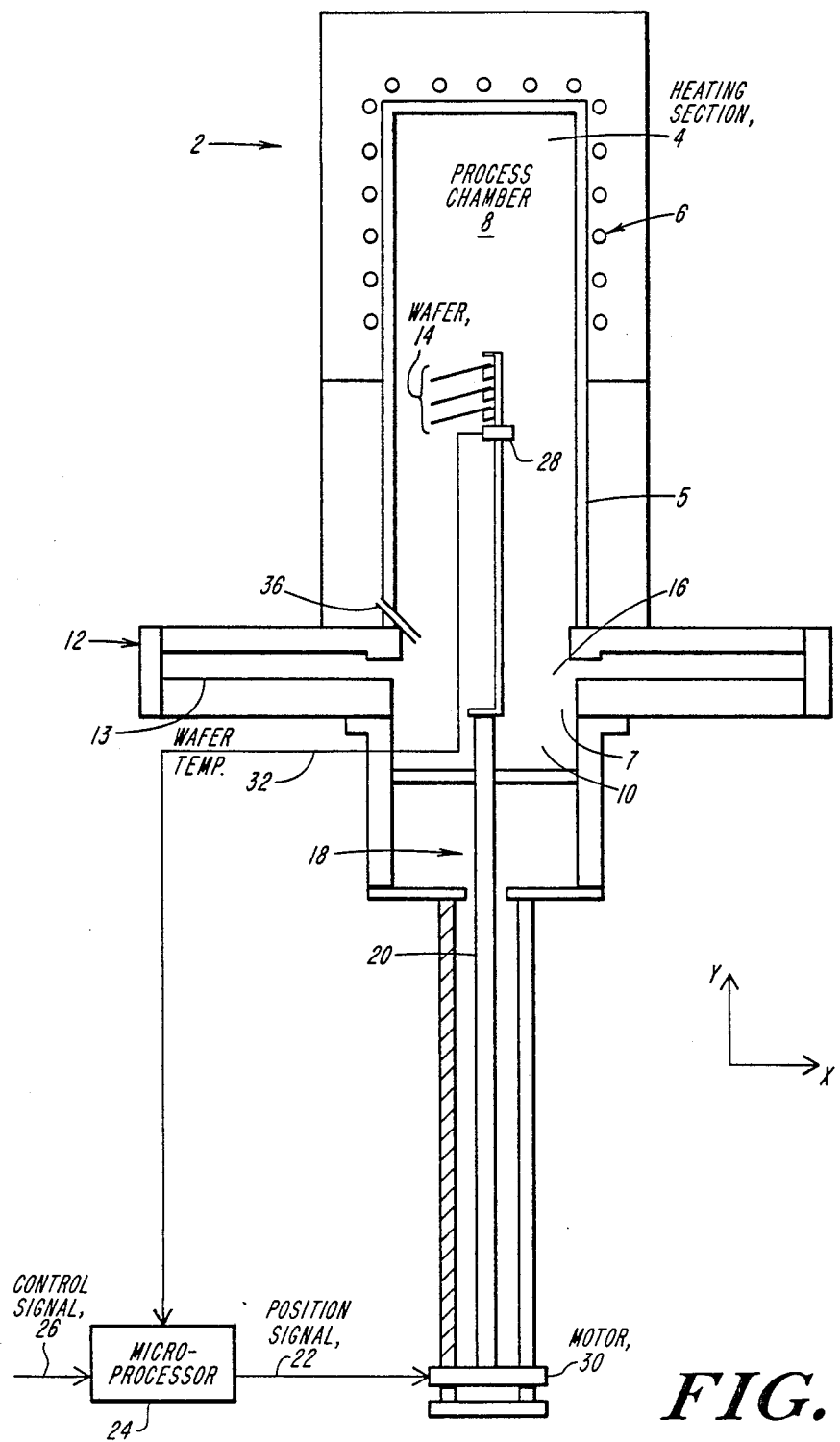
FIG. 2 is a schematic diagram of a horizontal embodiment of the invention.

Additionally, the use of a resistance heated or RF heated blackbody cavity produces enhanced temperature uniformity during ramping periods, in contrast to lamp powered systems. The invention utilizes no critical components such as reflectors or windows and has a heating rate equal to that of lamp systems, with a much faster cooling rate. Lastly, those skilled in the art will realize that the embodiments illustrated in FIGS. 1 and 2 provides low cost operation with low maintenance requirements.

It will thus be seen that the invention efficiently attains the objects set forth above, among those made apparent from the preceding description. It will be understood that changes may be made in the above construction and in the foregoing sequences of operation without departing from the scope of the invention. It is accordingly intended that all matter contained in the above description or shown in the accompanying drawings be interpreted as illustrative rather than in a limiting sense.

It is also to be understood that the following claims are intended to cover all the generic and specific features of the invention as described herein, and all statements of the scope of the invention which, as a matter of language, might be said to fall therebetween.

Having described the invention, what is claimed as new and secured by Letters Patent is:

1. A semiconductor wafer processing furnace comprising:
    (a) an elongated processing chamber enclosing a first zone and a second zone extending along a first reference axis;
    (b) a wafer support assembly including a support member and an associated translation means for selectively translating said support member between said zones along said first reference axis in response to an applied position signal;
    (c) first temperature means, including heating means for generating heat, for controlling said first zone to be substantially at a first temperature;
    (d) second temperature means for controlling said second zone to be substantially at a second temperature; and
    (e) a controller including means responsive to an applied control signal for generating said position signal and for applying said position signal to said translation means, said control signal being representative of a desired temperature of a region proximal to said support member, so that, in response to said position signal, said translation means translates said support member to position said support member along said reference axis such that the temperature of said region substantially matches said desired temperature.

2. A furnace according to claim 1 further comprising means for controlling the temperature gradient along said first reference axis to be monotonic between said first and second zones.

3. A furnace according to claim 1 further comprising sensor means for generating a temperature signal representative of the temperature of the region proximal to said support member, and wherein said controller further includes means responsive to said temperature signal and said applied control signal for generating said position signal, said position signal being representative of the difference between the temperature of said region and said desired temperature.

4. A furnace according to claim 1 further comprising sensor means for generating a temperature signal representative of the temperature of a semiconductor wafer, and wherein said controller further includes means responsive to said temperature signal and said applied control signal for generating said position signal, said position signal being representative of the difference between the temperature of the wafer and a desired temperature of the wafer.

5. A furnace according to claim 1 wherein said first reference axis is substantially vertical.

6. A furnace according to claim 1 wherein said first reference axis is substantially horizontal.

7. A furnace according to claim 1 further comprising means for generating said control signal.

8. A furnace according to claim 1 wherein said generating means includes means for generating said control signal to be representative of any of an up-ramp state, a constant state, or a down-ramp state.

9. A furnace according to claim 1 further comprising means for automatically loading at least one semiconductor wafer-to-be-processed onto said support member.

10. A furnace according to claim 1 further comprising means for automatically unloading at least one semiconductor wafer-to-be-processed from said support member.

11. A furnace according to claim 1 further comprising means for supporting a semiconductor wafer-to-be-processed in said region proximal to said support member.

12. A semiconductor wafer processing furnace comprising:
(a) an elongated processing chamber enclosing a first zone and a second zone extending along a first reference axis;
(b) a wafer support assembly including a support member and an associated translation means for selectively translating said support member between said zones along said first reference axis in response to an applied position signal;
(c) first temperature means, including heating means for generating heat, for controlling said first zone to be substantially at a first temperature;
(d) sensor means for generating a temperature signal representative of the temperature of the region proximal to said support member; and
(e) a controller including means responsive to said temperature signal and an applied control signal for generating said position signal and for applying said position signal to said translation means, said control signal being representative of a desired temperature of said region, and said position signal being representative of the difference between the temperature of said region and said desired temperature, so that, in response to said position signal, said translation means translates said support member to position said support member along said reference axis such that the temperature of said region substantially matches said desired temperature.

13. A furnace according to claim 12 wherein said sensor means includes means for generating a temperature signal representative of the temperature of a semiconductor wafer.

14. A furnace according to claim 12 wherein said first reference axis is substantially vertical.

15. A furnace according to claim 12 wherein said first reference axis is substantially horizontal.

16. A furnace according to claim 12 further comprising means for controlling the temperature of said second zone to be substantially at a second temperature.

17. A furnace according to claim 12 further comprising means for controlling the temperature gradient along said first reference axis to be monotonic between said first and second zones.

18. A furnace according to claim 12 further comprising means for generating said control signal.

19. A furnace according to claim 12 wherein said generating means includes means for generating said control signal to be representative of a desired up-ramp state followed by a constant followed by a down-ramp state.

20. A furnace according to claim 12 further comprising means for automatically loading at least one semiconductor wafer-to-be-processed on to said support member.

21. A furnace according to claim 20 further comprising means for automatically unloading at least one semiconductor wafer-to-be-processed from said support member.

22. A furnace according to claim 12 further comprising means for supporting a semiconductor wafer-to-be-processed in said region proximal to said support member.

23. A furnace according to claim 22 wherein said supporting means includes means for controlling the magnitude of thermal radiation of said supported wafer-to-be-processed to be substantially uniform across said supported wafer-to-be-processed.

24. A furnace according to claim 23 wherein said means for controlling said magnitude includes a thermal reflector positioned about the periphery of said supported wafer-to-be-processed.

25. A furnace according to claim 22 wherein said wafer supporting means includes said support member and means for positioning said wafer-to-be-processed with a predetermined side of said wafer-to-be-processed in said proximal region and opposite to and displaced from said support member.

26. A furnace according to claim 25 further comprising a plurality of ports disposed in the surface of said support member and opposite to the location of said predetermined side of a wafer-to-be-processed which is supported by said wafer positioning means, and means for coupling said ports to a gas supply.

27. A furnace according to claim 12 wherein said chamber is constructed from the groups consisting of alumina, silicon carbide, quartz and ceramic material.

28. A furnace according to claim 12 further comprising cooling means within said chamber, said cooling means including means for selectively directing a flow of cooling gas across at least one surface of a wafer-to-be-processed affixed to said surface member.

* * * * *